(12) United States Patent
Huang et al.

(10) Patent No.: US 8,141,242 B2
(45) Date of Patent: Mar. 27, 2012

(54) METHOD OF FABRICATING GOLD FINGER OF CIRCUIT BOARD

(75) Inventors: Tsu-Shun Huang, Taoyuan County (TW); Han-Ning Pei, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 1187 days.

(21) Appl. No.: 11/924,618

(22) Filed: Oct. 26, 2007

(65) Prior Publication Data

US 2009/0020320 A1 Jan. 22, 2009

(30) Foreign Application Priority Data

Jul. 16, 2007 (TW) ............................... 96125831 A

(51) Int. Cl.
*H05K 3/02* (2006.01)
(52) U.S. Cl. ............... 29/847; 29/417; 29/846; 174/254
(58) Field of Classification Search ............... 174/254, 174/538; 216/13, 41; 257/690, 692; 29/414, 29/417, 830, 831, 846, 847
See application file for complete search history.

(56) References Cited

U.S. PATENT DOCUMENTS

| | | | | |
|---|---|---|---|---|
| 5,956,237 A | * | 9/1999 | Kohmura et al. | 174/538 |
| 6,312,614 B1 | * | 11/2001 | Arimitsu et al. | 216/41 |
| 7,126,452 B2 | * | 10/2006 | Teshima et al. | 29/602.1 |
| 7,384,566 B2 | * | 6/2008 | Chen et al. | 29/847 |

FOREIGN PATENT DOCUMENTS

| | | |
|---|---|---|
| CN | 1780534 | 5/2006 |
| KR | 10-0330634 | 3/2002 |
| KR | 10-2006-0108045 | 10/2006 |

OTHER PUBLICATIONS

"1st Office Action of China counterpart application", issued on Sep. 25, 2009, p. 1-p. 5.
"1st Office Action of Korean counterpart application", issued on Sep. 30, 2009, p. 1-p. 4.

* cited by examiner

*Primary Examiner* — Donghai D. Nguyen
(74) *Attorney, Agent, or Firm* — Jianq Chyun IP Office

(57) ABSTRACT

A method for fabricating a gold finger of a circuit board is provided. First, a circuit board having a board edge for cutting is provided. Next, a copper conducting wire pattern is formed on the circuit board. The copper conducting wire pattern includes a plurality of gold finger bodies and a plurality of tie bars. Each tie bar is connected to a corresponding gold finger body, and the tie bars are disposed across the board edge. Thereafter, a surface of each gold finger body is plated with gold, and the tie bars on the board edge are removed by etching. Because the tie bars on the board edge are removed, tear resistance of the gold finger is maintained after cutting the board edge.

8 Claims, 5 Drawing Sheets

METHOD OF FABRICATING GOLD FINGER OF CIRCUIT BOARD

CROSS-REFERENCE TO RELATED APPLICATION

This application claims the priority benefit of Taiwan application serial no. 96125831, filed on Jul. 16, 2007. All disclosure of the Taiwan application is incorporated herein by reference.

BACKGROUND OF THE INVENTION

1. Field of the Invention

The present invention generally relates to a gold finger of a circuit board and fabrication method thereof, and more particularly, to a gold finger of a circuit board having better tear resistance and fabrication method thereof.

2. Description of Related Art

The main function of a circuit board is to provide connecting circuits between devices. Furthermore, as electronic apparatus becomes increasingly sophisticated and includes more and more devices, the circuits and devices on the circuit board get denser and denser. To connect a circuit board with a motherboard, a connector commonly called 'gold finger' is used. The gold finger is normally fabricated using a material such as gold or tin.

Using a Dual In-line Memory Module (DIMM) circuit board as an example, a front view of the conventional DIMM type circuit board is shown in FIG. 1A. As shown in FIG. 1A, the conventional DIMM type circuit board 100 includes a random access memory chip area 102 and a plurality of gold finger 104 leads.

FIG. 1B is a magnified view of area B in FIG. 1A. As shown in FIG. 1B, each of the gold finger 104 leads of the DIMM type circuit board normally includes a gold finger body 106 and a plated conducting wire (also called a tie bar) 108. However, in the DIMM type circuit board technique, because a plating operation is often required after performing an etching operation to obtain independent copper conducting wires, conductive pathways must be pre-formed. For example, to plate the copper conducting wires of the gold finger bodies 106 in the gold finger 104 area, the specially retained tie bars 108 are used to receive the current from a cathode pole outside the board. In a subsequent cutting process to form the circuit board after the plating operation, the circuit board is cut along a board edge 110 to form the gold finger 104 leads as shown in FIG. 1B.

However, cutting is normally performed using a cutting tool such as a sawing knife. Therefore, in the process of forming the circuit board or testing the DIMM product, some of the tie bars may be broken or peeled off due to plugging and unplugging. Moreover, these defects may occur when the DIMM type circuit board is subsequently installed.

Therefore, the industry frequently adopts the following methods to improve the DIMM type circuit board without changing the number of DIMM type circuit board layers or circuit design.

One method is to change the material of the tie bars so as to enhance the peel strength between copper skin and resin. However, the actual defect rate of the tie bars shows that the improvement on the defects is minimal.

Another method is to improve the forming pathway of the circuit board and perform a fine repair. This method has strict rules regarding the useful life of the cutting tools for performing the fine repair. Yet, the improvement is not significant. According to statistics, the defect rate of the tie bars is normally around 0.5%~1%. By applying the foregoing method, the defect rate drops slightly from 1% to about 0.7%~0.8%.

More recently, another method is to provide the circuit board with tilted edge. The results of measurement show that the defect rate can be reduced to about 0.5% (about 5000 DPPM).

Regardless of whether to change the material, improve the forming pathway or provide tilted edges, the standard cutting method is still used. Therefore, the interface between the metal of the tie bars and the epoxy resin layer and the fiber resin layer of the circuit board can be easily damaged, thereby leading to a reduction of tear resistance.

SUMMARY OF THE INVENTION

Accordingly, the present invention provides a method for fabricating a gold finger of a circuit board capable of increasing the peel strength of tie bars of the gold finger.

The present invention also provides a gold finger of a circuit board such that ties bars of the gold finger are drawn back by using a recombination of the existing circuit board processes without changing any circuit board design or affecting the main production cost of the circuit board.

According to an embodiment of the present invention, a method for fabricating gold finger of a circuit board is provided. First, a circuit board having a board edge for cutting is provided. After that, a copper conducting wire pattern is formed on the circuit board. The copper conducting wire pattern includes a plurality of gold finger bodies and a plurality of tie bars. Each tie bar is connected to a corresponding gold finger body, and the tie bars are disposed across the board edge. Thereafter, a surface of each gold finger body is plated with gold, and the tie bars on the board edge are removed by etching.

In an embodiment of the present invention, the step of plating the gold finger bodies with gold includes covering the circuit board with a first dry film, wherein the first dry film has a plurality of openings with each opening exposing a corresponding gold finger body. Thereafter, gold is plated on the exposed surface of the gold finger bodies, and then the first dry film is removed. Furthermore, each opening in the step of covering the circuit board with the first dry film also exposes a portion of the tie bar.

In an embodiment of the present invention, the copper conducting wire pattern in the step of forming a copper conducting wire pattern on the circuit board further include an externally connected conducting wire located in an area outside the board edge and connected to each tie bar.

In an embodiment of the present invention, the step of removing the tie bars on the board by etching further includes covering the circuit board with a second dry film, wherein the second dry film has a plurality of openings. These openings respectively expose the tie bars on the board edge. Thereafter, an etching solvent is used to remove the exposed tie bars, and then the second dry film is removed. The etching solvent can be acid solvent or alkaline solvent. The acid solvent includes copper chloride or ferric chloride and the alkaline solvent includes ammonia water, for example.

The present invention also provides a gold finger of a circuit board, wherein the gold finger includes a gold finger body and a tie bar. The gold finger body is disposed on a circuit board, and a surface of the gold finger body is plated with gold. The tie bar is connected to the gold finger body and is separated by a distance from a board edge of the circuit board.

In an embodiment of the present invention, the aforementioned distance is greater than 0.05 mm.

In an embodiment of the present invention, a portion of the surface of the tie bar connected to the gold finger body is also plated with gold.

In an embodiment of the present invention, the material of the gold finger body and the tie bar is copper.

In the present invention, a portion of the tie bar that needs to be cut is first removed by etching so that the forming process will not cut through the tie bar. Thus, sufficient tear resistance is maintained for resisting the plugging and unplugging of the circuit board module during functional tests or the plugging and unplugging of the circuit board module by users. As a result, the defect rate of the circuit board is lowered substantially and the technique is particularly suitable for applying to DIMM type circuit board.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
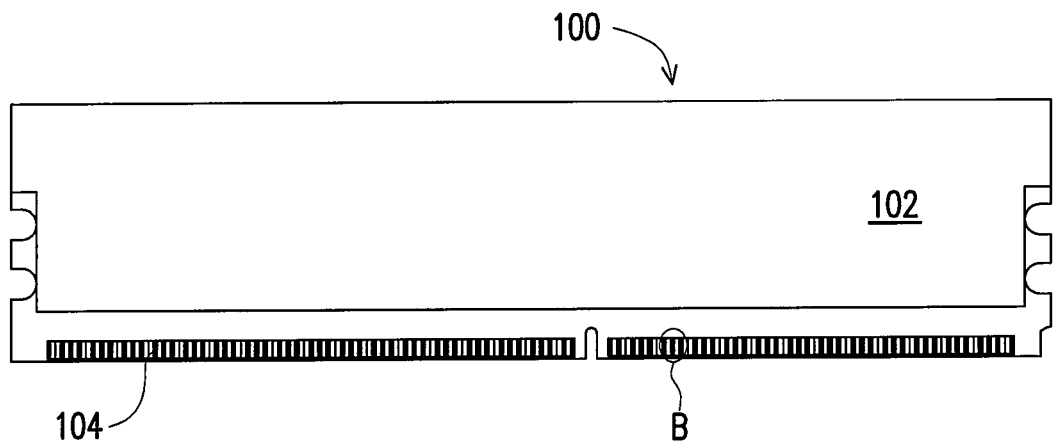
FIG. 1A is a front view of the conventional DIMM type circuit board.
Figure 1B:
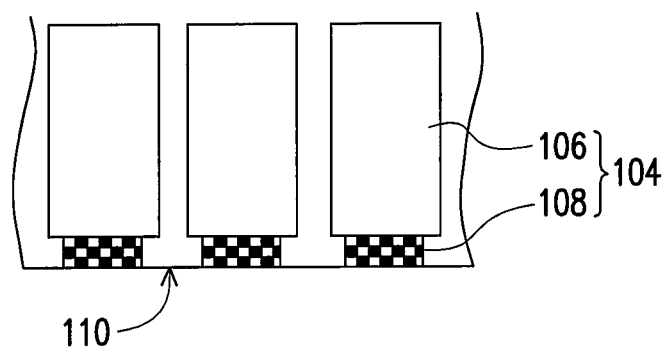
FIG. 1B is a magnified view of area B in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

The embodiments of the present invention are more fully illustrated below using the appended diagrams. However, the present invention can be implemented in different ways so that the description in the present invention should not be interpreted as only method of implementation. In reality, the disclosed embodiments serve only to provide a more detailed and complete view of the present invention and transmit the scope of claims to those skilled in the art. In the following diagrams, the size and relative size of each layer or area may be drawn with slight exaggeration so as to improve clarity.

It should be noted that although common terms such as 'first', 'second' and so on are used to describe various devices, areas, layers and/or parts, these terms should not limit the devices, areas, layers and/or parts. In fact, these terms are used only to distinguish a particular device, area, layer and/or part from another device, area, layer and/or part. Therefore, without departure from the disclosure of the present invention, the first device, area, layer and/or part in the following description can also be called a second device, area, layer or part.

In addition, the terms used in the following description are used for describing a specific embodiment and are never intended to limit the scope of the present invention. For example, the singular form 'one' and 'described' used in the disclosure also include plural form unless a clear indication is provided elsewhere in the description.

FIGS. 2A to 2F are top views showing a process for fabricating a gold finger of a circuit board according to a first embodiment of the present invention.

Figure 2A:
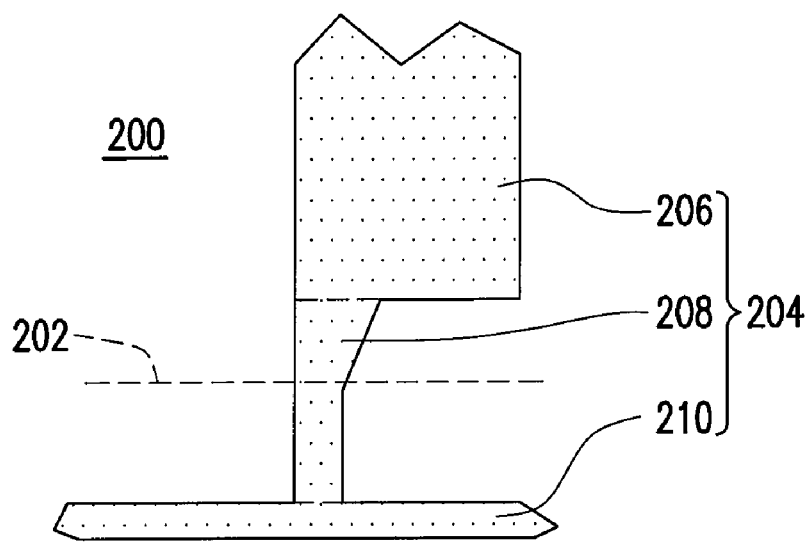
FIGS. 2A to 2F are top views showing the process of fabricating gold finger of a circuit board according to a first embodiment of the present invention.

As shown in FIG. 2A, a circuit board 200 is provided. The circuit board 200 has a board edge 202 for cutting. Thereafter, a copper conducting wire pattern 204 is formed on the circuit board 200. The copper conducting wire pattern 204 includes a gold finger body 206 and a tie bar 208. The tie bar 208 is connected to the gold finger body 206, and the tie bar 208 is disposed across the board edge 202. In addition, the copper conducting wire pattern 204 in FIG. 2A may also include an externally connected conducting wire 210. This externally connected conducting wire 210 is normally located in an area outside the board edge 202 and connected to the tie bar 208 so as to pass an electric current in a subsequent plating process.

Figure 2B:
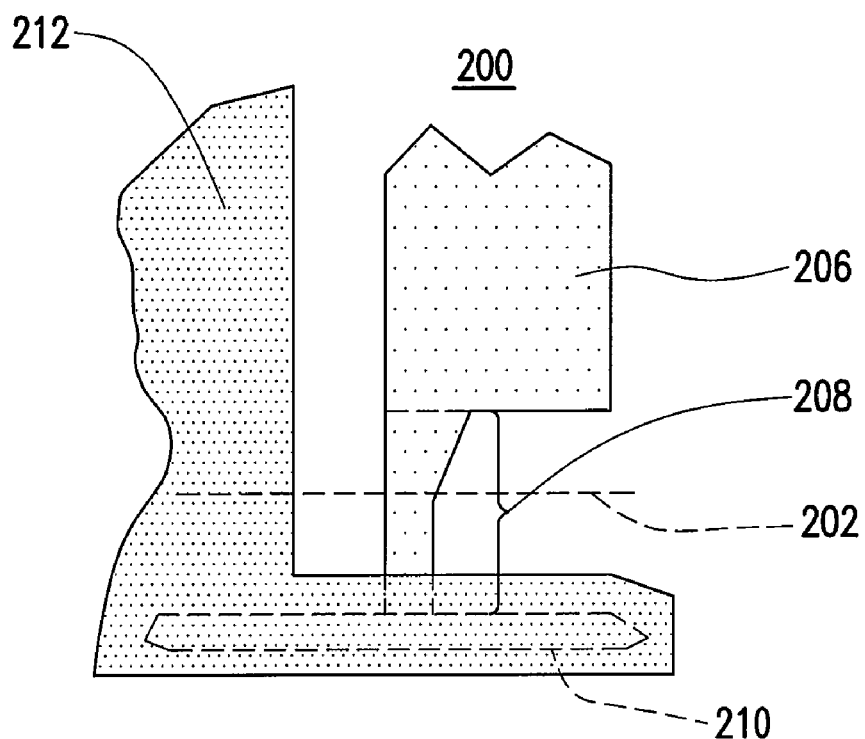

Next, as shown in FIG. 2B, a solder-resistant layer (also known as solder mask) 212 is coated over the whole circuit board 200 before plating the gold finger body 206 with gold in the conventional circuit board technique. The solder-resistant layer 212 protects the circuits on the circuit board 200 and prevents the circuit board 200 from receiving scratches that might result in a short-circuit and/or broken circuit condition, thereby achieving an anti-soldering function. In FIG. 2B, the solder-resistant layer 212 also exposes the gold finger body 206 and the tie bar 208 to be fabricated on the circuit board 200. The solder-resistant layer 212 can be fabricated using photosensitive material, thermal sensitive material or a combination thereof. For example, the solder-resistant layer 212 can be green paint such as ultraviolet type green paint or thermal-hardened type green paint. The method of coating the solder-resistant layer 212 includes, for example, roller coating, curtain-coating, screen-printing, dipping, or dry film forming.

Figure 2C:
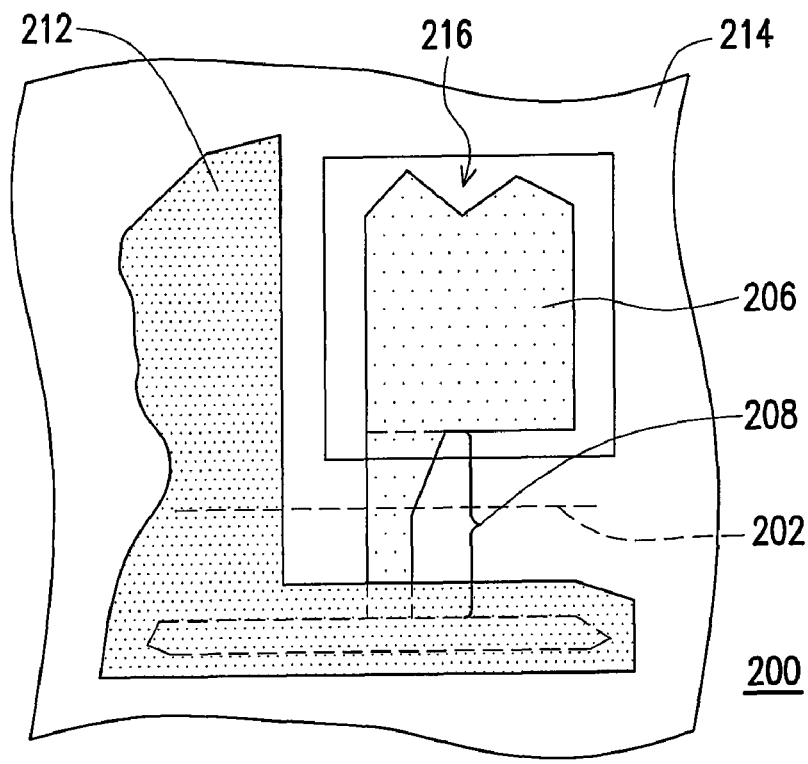

Thereafter, as shown in FIG. 2C, a first dry film 214 is formed over the circuit board 200, wherein the first dry film 214 has an opening 216 that exposes the gold finger body 206. In addition, the opening 216, as shown in the figure, may further expose a portion of the tie bar 208 so as to prevent any misalignment of the opening 216 that results from a photolithographic operation from affecting the plating area of the gold finger body 206.

Figure 2D:
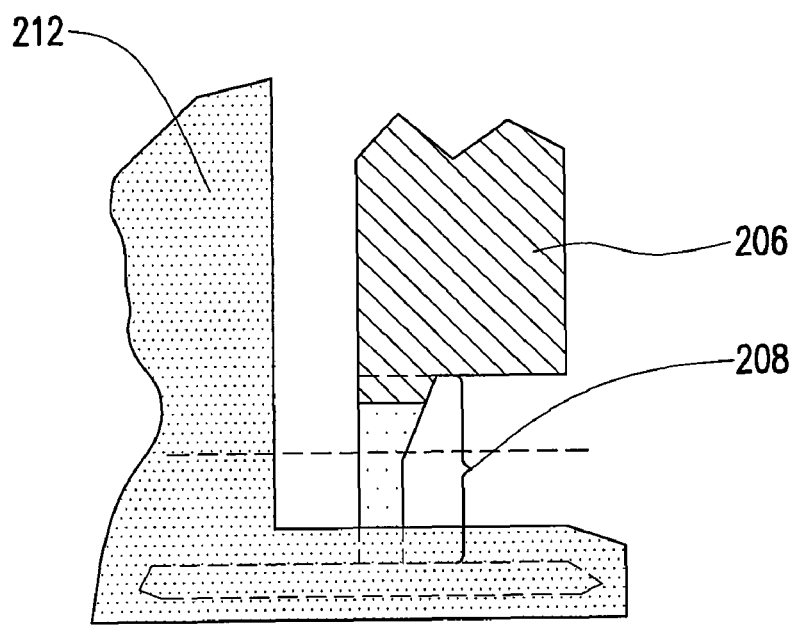

Next, as shown in FIG. 2D, the surface of the gold finger body 206 exposed by the first dry film 214 (refer to FIG. 2C) is plated with gold. At this time, if the opening 216 also exposes a portion of the tie bar 208 as shown in FIG. 2C, the surface of the exposed tie bar 208 is also plated with gold. Thereafter, the first dry film 214 is removed. The method of removing the first dry film 214 includes, for example, applying a photoresist-removing agent such as sodium hydroxide solution or other marketed product.

Figure 2E:
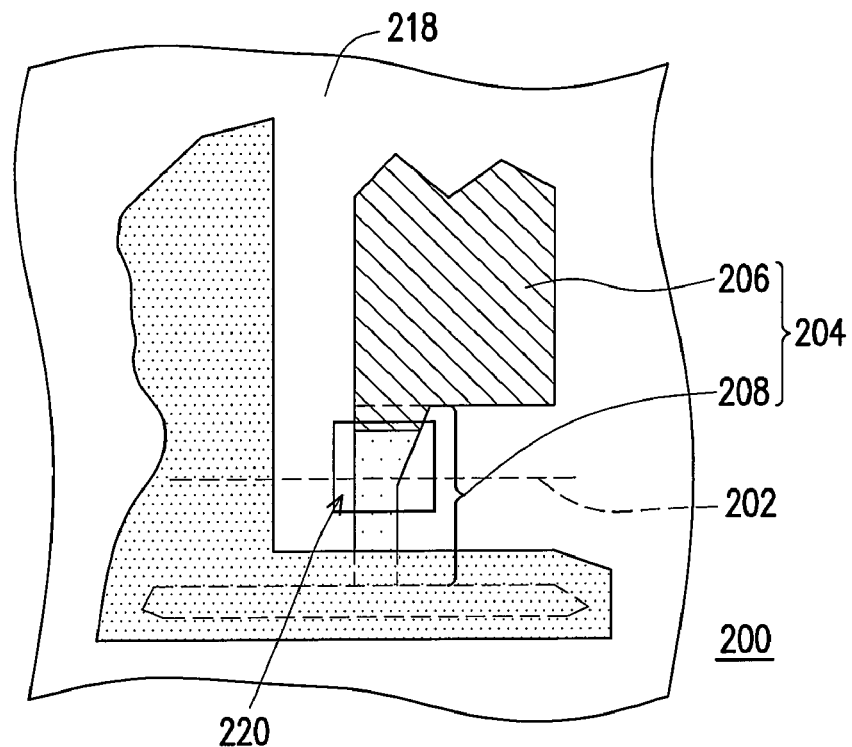

Next, as shown in FIG. 2E, a second dry film 218 can be formed over the circuit board 200 for removing the tie bar 208 on the board edge 202 by performing an etching process. The second dry film 218 has an opening 220 that exposes the tie bar 208 on the board edge 202. It should be noted the opening 220 absolutely must not expose the gold finger body 206. Moreover, the second dry film 218 can be fabricated using a material identical or non-identical to the material of the first dry film 214.

Figure 2F:
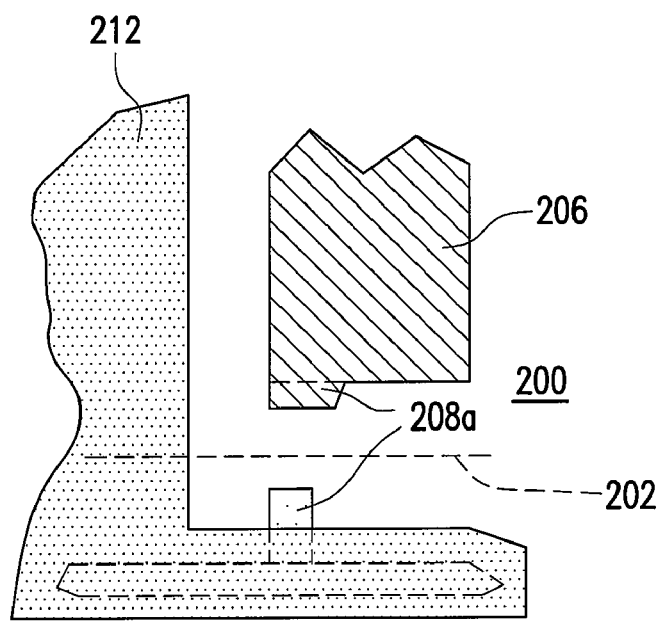

Next, as shown in FIG. 2F, an etching solvent can be used to remove the tie bar 208 exposed by the opening 220 (refer to FIG. 2E). The etching solvent can be acid solvent or alkaline solvent. The acid solvent is copper chloride (CuCl) or ferric chloride ($FeCl_3$) and the alkaline solvent is ammonia water (NH₄OH), for example. Afterwards, the second dry film 218 is removed. The method of removing the second dry film 218 includes, for example, applying a photoresist-removing agent such as sodium hydroxide solution or other marketed product. The remaining portions of the tie bar 208a are respectively formed inside and outside the board edge 202.

Figure 3A:
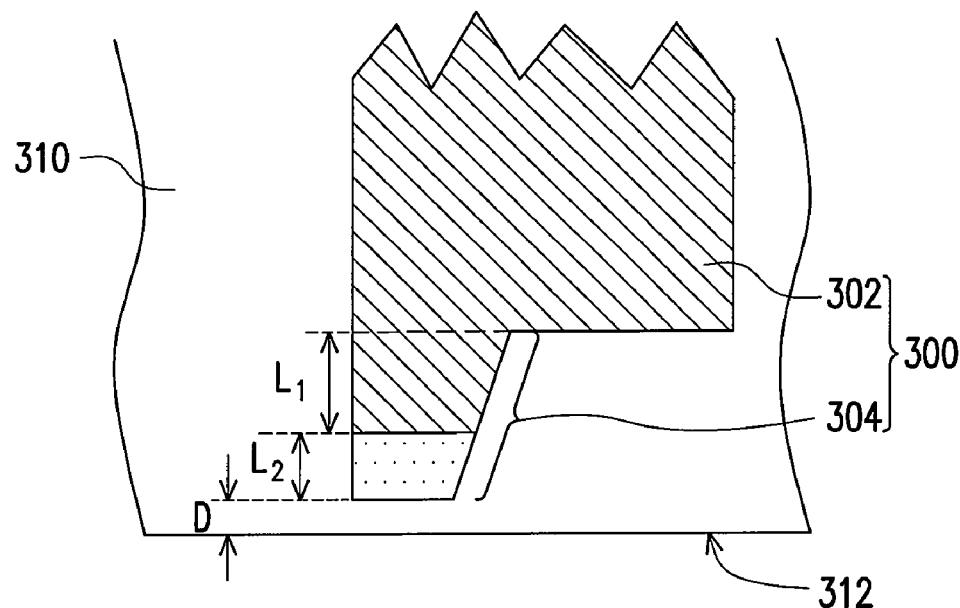
FIG. 3A is a top view of gold finger of a circuit board according to a second embodiment of the present invention.
Figure 3B:
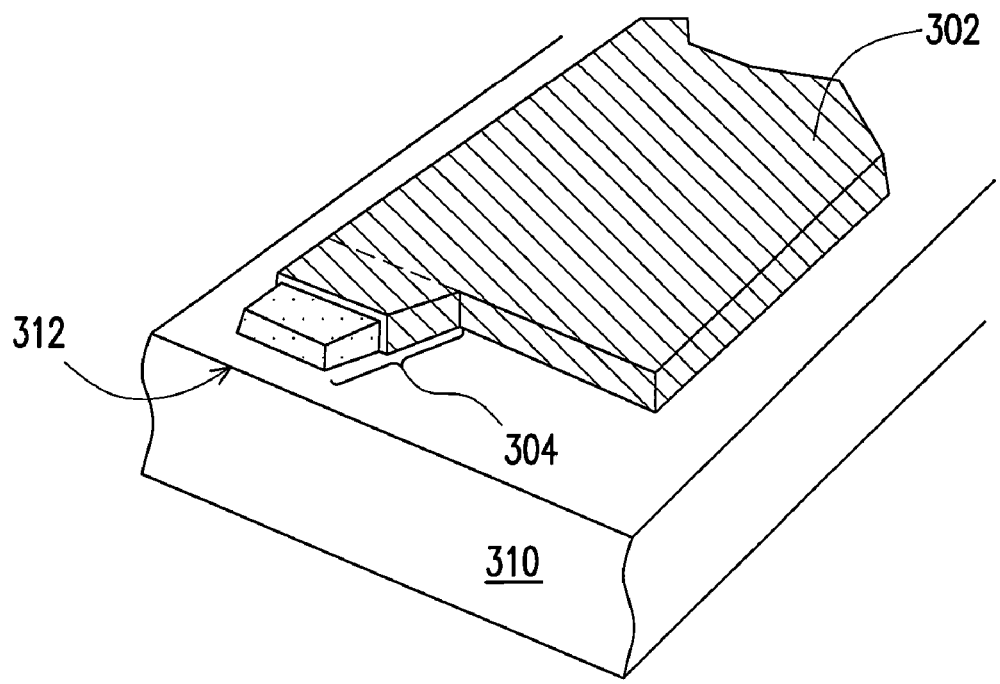
FIG. 3B is a perspective view of the gold finger shown in FIG. 3A.

FIG. 3A is a top view of a gold finger of a circuit board according to a second embodiment of the present invention. FIG. 3B is a perspective view of the gold finger shown in FIG. 3A.

As shown in FIGS. 3A and 3B, the gold finger 300 of the circuit board in the second embodiment includes a gold finger body 302 and a tie bar 304. The material of the gold finger body 302 and the tie bar 304 is copper, for example. The gold finger body 302 is disposed on a circuit board 310, and a surface of the gold finger body 302 is plated with gold. The tie bar 302 is connected to the gold finger body 302 and the tie bar 302 is separated from the board edge 312 by a distance D. The distance D is, for example, greater than 0.05 mm so as to prevent the sawing knife from contacting the tie bar 304 when cutting the board edge 312.

Referring to FIGS. 3A and 3B, a portion of the surface of the tie bar connected to the gold finger body is also plated with gold. For example, in the second embodiment, the lengths along a direction perpendicular to the board edge 312 whose surfaces are respectively plated with gold and not plated with gold are $L_1$ and $L_2$. The smallest value of $L_1$ is 0 and the largest value of $L_2$ is about 0.15 mm, for example. Obviously, anyone skilled in the art may modify the range of $L_1$ and $L_2$ according to the actual requirements.

In summary, by modifying the plated dry film of the circuit board and additionally etching the tie bar, a section of the tie bar that needs to be cut is removed by etching. As a result, the tie bar is not cut and the tear resistance of the circuit board is maintained. Through measurements, defect rate of the tie bar drops from the former 0.5%~1% (5000~10000 Dppm) to below 200 ppm. Therefore, the present invention is suitable for all circuit boards requiring gold finger, including the DIMM type circuit board.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating gold finger of a circuit board, comprising:
   providing a circuit board having a board edge for cutting;
   forming a copper conducting wire pattern on the circuit board, wherein the copper conducting wire pattern comprises a plurality of gold finger bodies and a plurality of tie bars, and each tie bar is connected to a corresponding gold finger body and the tie bars are disposed across the board edge;
   plating a surface of the gold finger bodies with gold;
   performing an etching process to remove the tie bars on the board edge; and
   cutting the board edge at locations having the tie bars removed to separate the board edge from the circuit board.

2. The method according to claim 1, wherein the step of plating the surface of the gold finger bodies comprises:
   forming a first dry film over the circuit board, wherein the first dry film comprises a plurality of openings, and each opening exposes a corresponding gold finger body;
   plating the exposed gold finger bodies with gold; and
   removing the first dry film.

3. The method according to claim 2, wherein the step of forming the first dry film over the circuit board further comprises forming the opening such that a portion of the tie bar is exposed.

4. The method according to claim 1, wherein the step of forming the copper conducting wire pattern on the circuit board further comprises forming an externally connected conducting wire located in an area outside the board edge and connected to the tie bars.

5. The method according to claim 1, wherein the step of performing the etching process to remove the tie bars on the board edge comprises:
   forming a second dry film over the circuit board, wherein the second dry film comprises a plurality of openings, and the openings respectively exposes the tie bars on the board edge;
   removing the exposed tie bars using an etching solvent; and
   removing the second dry film.

6. The method according to claim 5, wherein the etching solvent comprises acid solvent or alkaline solvent.

7. The method according to claim 6, wherein the acid solvent comprises copper chloride or ferric chloride.

8. The method according to claim 6, wherein the alkaline solvent comprises ammonia water.

* * * * *